(12) United States Patent
Lin et al.

(10) Patent No.: US 6,795,948 B2
(45) Date of Patent: Sep. 21, 2004

(54) WEIGHTED RANDOM PATTERN TEST USING PRE-STORED WEIGHTS

(75) Inventors: Chih-Jen Lin, Austin, TX (US); David M. Wu, Austin, TX (US)

(73) Assignee: Intel Corporation, Santa Clara, CA (US)

( * ) Notice: Subject to any disclaimer, the term of this patent is extended or adjusted under 35 U.S.C. 154(b) by 541 days.

(21) Appl. No.: 09/750,200

(22) Filed: Dec. 27, 2000

(65) Prior Publication Data

US 2003/0074615 A1 Apr. 17, 2003

(51) Int. Cl.[7] ............................................. G06F 17/50
(52) U.S. Cl. ................................................. 716/1; 716/4
(58) Field of Search ............. 716/1, 4–5; 714/724–729, 714/738–739

(56) References Cited

U.S. PATENT DOCUMENTS

| | | | |
|---|---|---|---|
| 4,687,988 A | | 8/1987 | Eichelberger et al. |
| 5,323,400 A | | 6/1994 | Agarwal et al. |
| 5,479,414 A | | 12/1995 | Keller et al. |
| 5,612,963 A | | 3/1997 | Koenemann et al. |
| 5,732,209 A | * | 3/1998 | Vigil et al. ................... 714/30 |
| 5,983,380 A | | 11/1999 | Motika et al. |
| 6,067,262 A | * | 5/2000 | Irrinki et al. ............... 365/201 |
| 6,134,684 A | * | 10/2000 | Baumgartner et al. ...... 714/724 |
| 6,175,160 B1 | * | 1/2001 | Paniccia et al. ............. 257/778 |
| 6,247,155 B1 | * | 6/2001 | Wright ........................ 714/741 |
| 6,367,042 B1 | * | 4/2002 | Phan et al. .................. 714/733 |
| 6,401,226 B1 | * | 6/2002 | Maeno ........................ 714/728 |
| 6,501,288 B1 | * | 12/2002 | Wilsher ....................... 324/753 |

OTHER PUBLICATIONS

PCT/US01/50807 International Search Report, filed Jan. 23, 2003.
Bassett, R.W., et al., "Low Cost Testing Of High Density Logic Components", *1999 International Test Conference*, pps. 553–555; Figures 8, 9.

* cited by examiner

Primary Examiner—Vuthe Siek
Assistant Examiner—Paul Dinh
(74) *Attorney, Agent, or Firm*—Blakely, Sokoloff, Taylor & Zafman LLP

(57) ABSTRACT

An apparatus and method of testing an integrated circuit by downloading a sequence of randomly weighted bits into a scan chain in which each bit has a distinctly determined weight generated in real-time by a weight generator. The weight generator has a switch controlled by a stored bit particular for each bit of the randomly weighted bits that determines the weight of the bit. The control signal is stored in a memory that is downloaded into the switch in synchronization with the generation of the bit. Preferably, the memory is on-die, and furthermore is a part of the integrated circuit.

3 Claims, 4 Drawing Sheets

WEIGHTED RANDOM PATTERN TEST USING PRE-STORED WEIGHTS

BACKGROUND OF THE INVENTION

1. Field of the Invention

The present invention relates to circuit testing, and more specifically to integrated circuit testing using weighted test inputs.

2. Background Information

Complex integrated circuits fabricated on a single semiconductor chip contain thousands of circuit elements, both sequential and combinational. These circuit elements are physically inaccessible for discrete stand-alone testing. Because of the complexity of the internal interconnections and interdependencies between the circuit elements, a testing of the individual circuit elements as well as the overall device integrity has becomes increasingly time consuming as the number of circuit elements has increased.

Prior art testing of integrated circuits employs the modification of at least some of the circuit under-test sequential (or storage) elements to include a latch and a coupled switch (multiplexer), and the serial coupling of these latched sequential elements to form at least one shift register between a test input generator and an output capturing circuit. The latches are each controlled by a system clock. Each serial coupling of sequential elements is referred to as a scan chain or scan register. Each latched sequential element is referred to as a scan element or scan flip-flop. The test inputs from the test generator are scanned into the storage elements and test results are scanned out of the storage elements through the scan register.

Each sequential circuit element is additionally coupled to at least one combinational circuit element forming a combinational logic block. In order to test the functionality and performance of a combinational logic block, various combinations of test bits arc input to the combinational logic block from the coupled scan element, received through a scan register. Each scan element (except at the ends of the chain) transmit an input to or receive an output from another coupled scan element or alternatively the coupled logic block according to the state of an signal input to the coupled switch. One of the storage devices forms the end of the chain, and receives a scan input from the test input generator that may be provided from an input pin to the integrated circuit. Another one of the storage devices forms the other end of the chain and provides a scan output provided to the output capturing circuit that may be to an output pin of the integrated circuit. Once a proper test input has been shifted into a scan element, it is switched to exercise the combinational logic block by transmitting the input state to the combinational logic block which respond to the test data in their usual manner. The result is captured by the scan element, and transferred to the capturing circuit by the scan chain, when the scan element is switched into the scan chain shifting mode.

Prior art testing employs a random pattern test input generator to generate to each scan chain of the integrated circuit under-test (and consequently selectably to each combinational logic block) a deterministic test pattern of logic 1 logic 0 bits, wherein the likelihood of a logic 1 value and a logic 0 value is equally likely. Prior art testing furthermore employs a weighted random pattern test input generator to generate random bits with probability of logic value 1 different from 0.5.

On a production line basis, it is rarely practical to fully test each element of an integrated circuit. Instead, a circuit is conventionally tested to a given level of accuracy. A high level of accuracy generally requires a plural number of input test sets for each scan chain. These test sets include a varying deterministic input weight. A large number of circuit elements therefore requires a great number of test data that must be delivered to the integrated circuit under-test on a real-time basis to minimize test time, where a test length which is unnecessarily high is unacceptable. Furthermore, this large amount of real-time data requires an expensive test fixture.

The problem is to provide a large amount of weight sets to an on-die weighted random pattern generator in real time fashion in order to achieve extremely high fault coverage.

BRIEF DESCRIPTION OF DRAWINGS

The present invention will be described by way of exemplary embodiments, but not limitations, illustrated in the accompanying drawings. Identical numerals indicate the same elements throughout the figures.

DETAILED DESCRIPTION OF THE INVENTION

In the following description, various aspects and details of the present invention will be described. However, it will be apparent to those skilled in the art that the present invention may be practiced with only some or all aspects of the present invention. For purposes of explanation, specific numbers, materials and configurations are set forth in order to provide a thorough understanding of the present invention. However, it will also be apparent to those skilled in the art that the present invention may be practiced without the specific aspects and details. In other instances, well known features are omitted or simplified, including apparatus and method steps, in order not to obscure the present invention.

Various operations will be described as multiple discrete steps performed in turn in a manner that is most helpful in understanding the present invention. However, the order of description should not be construed as to imply that these operations are necessarily order dependent, in particular, the order the steps are presented. Any necessary ordering is alternatively expressly mentioned or will be understood by those skilled in the art. Furthermore, the phrases "in one embodiment" and/or "an embodiment" are used repeatedly. However the phrases do not necessarily refer to the same embodiment, although they may.

Figure 1:
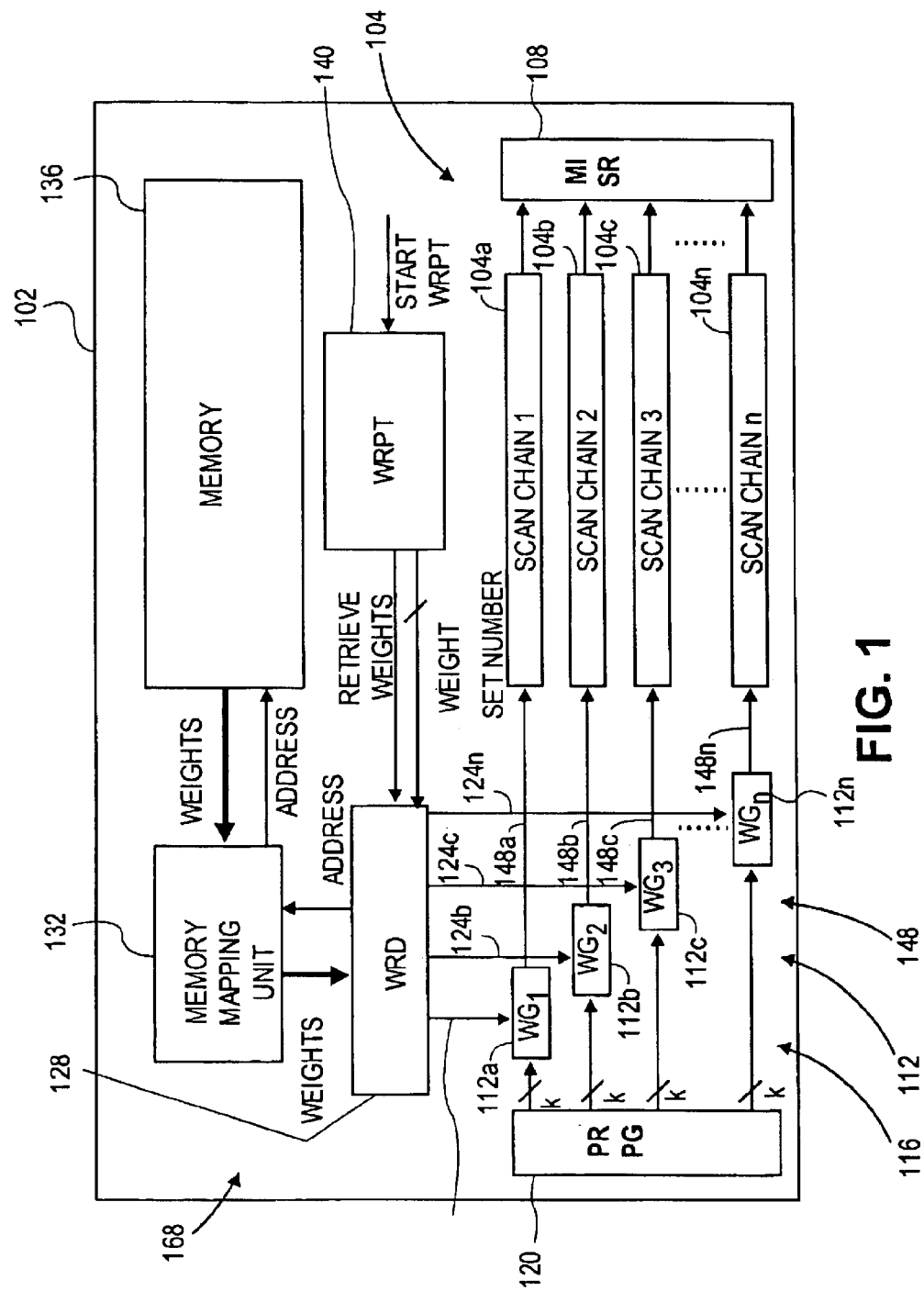
FIG. 1 portrays an embodiment of an integrated circuit of the present invention.

Referring to FIG. 1, an integrated circuit under-test includes at least one scan chain 104 that is portrayed as scan chains 104a–104n. The scan chain resides on a die 102. The scan chains 104 each include structured scan elements (not shown) of the integrated circuit under-test, each coupled to at least one structured combinational element circuit (not shown) of the integrated circuit under-test. The output side of each scan chain is coupled to alternatively an on-die or an off-die output capturing circuit portrayed as an on-die multi-input signature register (MISR) 108 that captures the output of each combinational element circuit after transmittal through the scan chain 104i (wherein "i" signifies any implemented scan chain). The MISR 108 compares the captured output bits with a predicted output bits to determine the validity of the circuit under-test. Generally, the compressed data is compared with the predicted output, conventionally termed a signature. Fault detection occurs if the signature realized by a circuit differs from the signature of the fault-free version of the circuit.

The data input to each scan chain is provided by a weight generator (WG) circuit 112 of the present invention that is portrayed as weight generators 112a–112n wherein as portrayed, WG 112a provides an input to a scan chain 104a, WG 112b provides an input to a scan chain 104b, WG 112c provides an input to a scan chain 104c, and WG 112n provides an input to a scan chain 104n. The design of an embodiment of a weight generator 112 is particularly taught presently with reference to FIG. 2. Preferably each weight generator 112 is on-die. Each weight generator 112i (wherein "i" signifies any implemented weight generator) provides a determined pseudo-random weighted input to the scan chain 104i to which it is coupled, "weight" meaning here the probability of obtaining a one bit value for each bit in the input to the scan chain 104i.

Each weight generator 112i receives pseudo-random signal inputs from a conventional pseudo-random pattern generator 120 (PRPG), in the form of "k" separate digital signal inputs 116i (wherein "i" signifies the "k" signal inputs to any weight generator 112i and in which each signal input comprises at least one separate signal line). It is specifically contemplated that the number of digital signals, as well as the statistical distribution of high and low bits (or ones and zeroes) on any one signal input, may be distinct for each weight generator 112i. Each weight generator 112i additionally receives a signal that the inventors preferably term a "random weight determining" signal input 124i (wherein "i" signifies an implemented random weight determining signal input to a weight generator "i" and in which each signal input comprises at least one separate signal line) forming a data field from a circuit the inventors preferably term a "Weight Retriever and Distributor" (WRD) circuit 128. The terms "random weight determining signal" and "Weight Retriever and Distributor" shall be used in this description hereafter. The random weight determining signal input 124i is a signal whose value determines the pseudo-random weighted scan input bits that are applied to the scan chain 112i, and their generation disclosed with reference to FIGS. 2 and 3 accordingly includes a derivation of the weight input to the scan chain 104. An embodiment of a weight generator 112i taught presently with reference to FIG. 2 discloses how the weight determining signal determines the applied weighted scan input bits. Each weight generator 112i circuit outputs a pseudo-random weight bit signal 148i (wherein "i" signifies any implemented pseudo random weight bit signal, here portrayed as a-n), the weight of any bit determined by the random weight determining signal 124i. The weight bit signal is shifted into the left most flip-flop of scan chain 104i for transfer down the scan chain 104i and eventual loading into a combinational element circuit.

A data download circuit 168 downloads each weight determining signal 124 data field of a data set stored in the memory 136 to the appropriate weight generator circuit 112i in synchronization with the weight generator circuit 112i providing the corresponding test data bit to the test data bit stream 148i. An embodiment of the data download circuit 168 comprises a control circuit portrayed as separate units 128, 132, 140 that reads each data field for the data set from the memory 136 to a buffer circuit 156, and a buffer circuit 156 that outputs each data field for a data set from the data download circuit 168 to the weight generator circuit 112i in synchronization with the weight generator circuit 112i providing the corresponding test data bit to each test data bit stream 148i. In the preferred embodiment, the data download circuit 168 comprises separate units portrayed in FIGS. 1 and 3 as the "Weight Retriever and Distributor" circuit 128, the "Weighted Random Pattern Test Controller" (WRPTC) circuit 140, and the "Memory Mapping Unit" circuit 132. As is understood by those skilled in the art, other specific control circuits provide the random weight determining signal 124 from a memory 136 to the weight generator 112i and are specifically included in the present invention. For instance, the inventors prefer a circuit implemented by a finite state circuit, but an alternative circuit includes a programmed computer. The preferred embodiment of the data download circuit is a circuit on the same die as the integrated circuit under-test.

An embodiment of the Weight Retriever and Distributor circuit 128 is specifically taught with reference to FIG. 3 below. The Weight Retriever and Distributor circuit 128 receives inputs from a memory 136 through a controller circuit the inventors preferably term a "Memory Mapping Unit circuit" 132, according to an input from a circuit the inventors preferably term a "Weighted Random Pattern Test Controller" circuit 140. Accordingly, each of the memory 136, the Memory Mapping Unit circuit 132, and the Weighted Random Pattern Test Controller circuit 140 shall each be taught when the description of the Weight Retriever and Distributor Circuit is presented with reference to FIGS. 1 and 3 below. The terms "Memory Mapping Unit", and "Weighted Random Pattern Test Controller" shall be used in this description hereafter to describe respectively the circuits 132, and 140.

Figure 2:
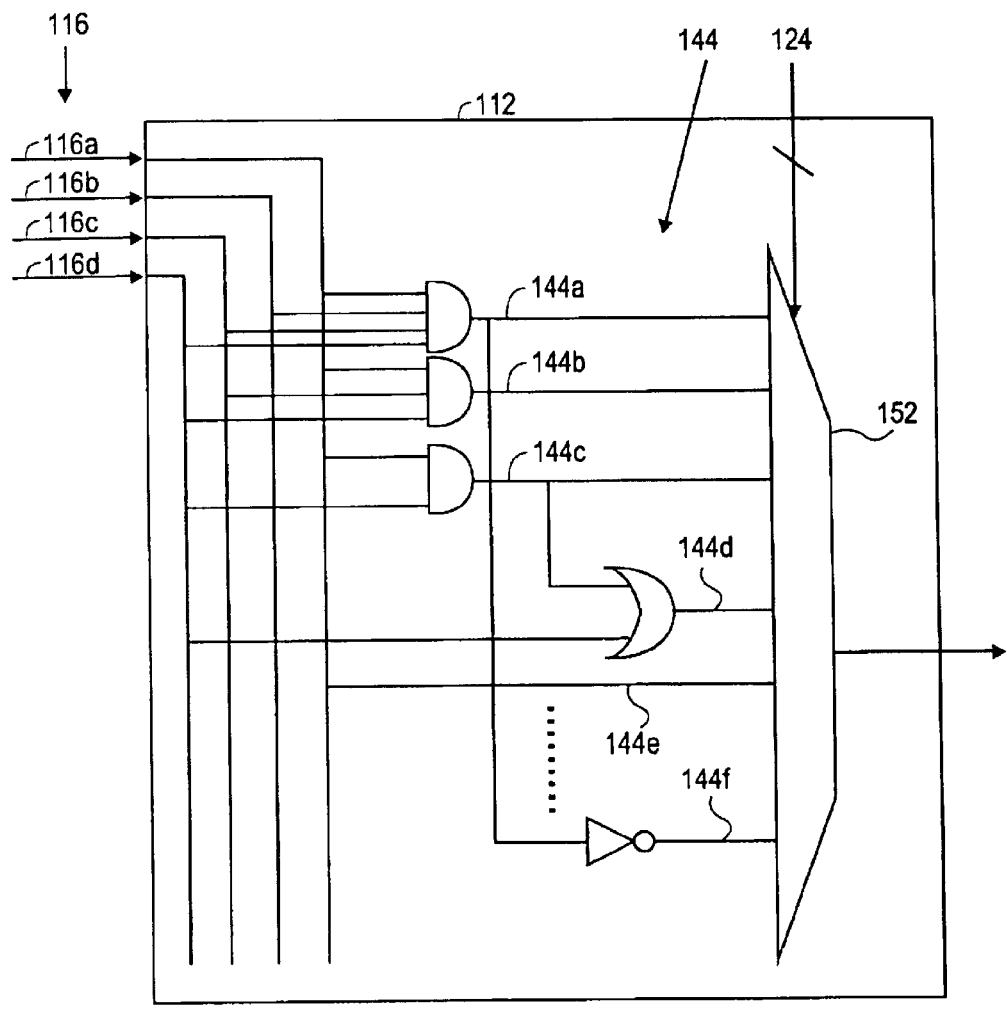
FIG. 2 portrays an embodiment of a weight generator of the present invention.

Referring now to FIG. 2, the weight generator 112i controls the specific weight of the weighted input signal input to a scan chain 104i. An embodiment of a weight generator 112 includes conventional random signal inputs 116 illustratively portrayed as four parallel lines 116ia–116id for a weight generator 112i. The signals 116ia≧116id each transmit a pseudo-random binary signal having an equal probability of a one and a zero. They form inputs to logic circuits generating logical combinations of the signals. For specifically the four signal inputs 116ia–116id, 15 different random weight signals 144 ranging in illustrative probability of a one bit from 1/16 to 15/16 are generated Random weight signal 144a illustratively represents a probability of 1/16, random weight signal 144b illustratively represents a probability of 2/16, random weight signal 144c illustratively represents a probability of 4/16, random weight signal 144d illustratively represents a probability of 10/16, random weight signal 144e illustratively represents a probability of 8/16, and random weight signal 144f illustratively represents a probability of 15/16. In the more general case where there are "n" conventional random weight signal inputs, each illustratively with an equal probability of a one and a zero, $2^n-1$ different random weight signals, ranging in probability from $1/2^n$ to $(2^n-1)/2^n$ are generated. Each of the different random weight signals couples to the input side of a switch (multiplexer) 152 controlled by a random weight determining signal 124i. The switch 152 selects from each of the coupled different random weight signals depending upon the value of the weight determining signal 124i. In the preferred embodiment, the random weight determining signal input 124i provides an n bit data field to switch a desired weight from the $2^n-1$ separate random weight signals 144, preferably configured as n separate lines each providing a bit. The random weight determining signal 124i controls on a bit for bit basis the content of the random weight bit signal 148i. The random weight determining signal is input from the memory 136 through the weight retriever and distributor circuit 128. Each weight determining signal 124i for a random weight bit of the random weight bit signal 148i is specifically determined from a stored value in the memory 136.

Figure 3:
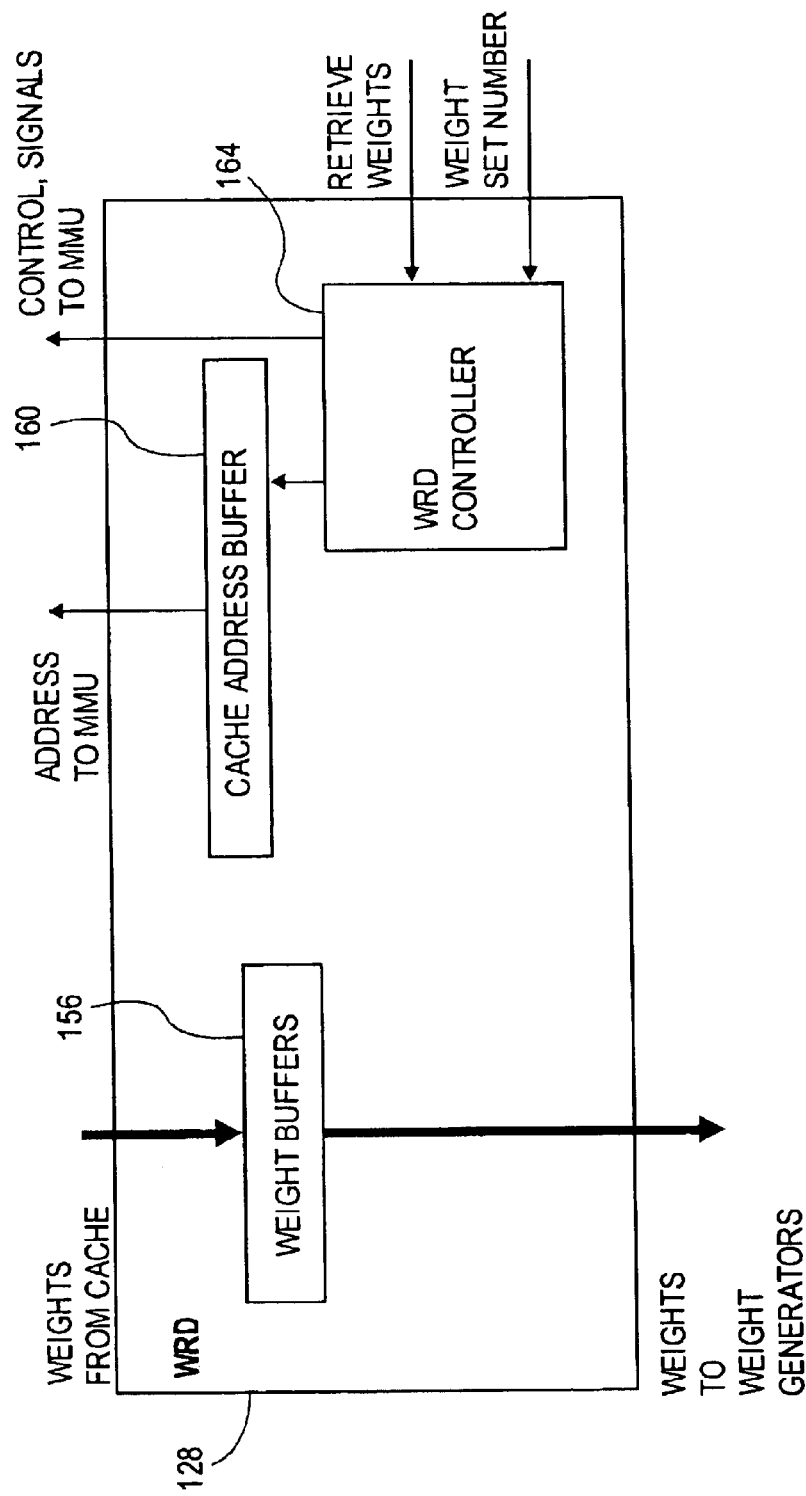
FIG. 3 portrays an embodiment of a Weight Retriever and Distributor of the present invention.

Referring now to FIG. 3, the weight retriever and distributor circuit 128 provides to each weight generator circuit (112i) switch 152 the weight determining signal 124i in synchronization with the random weight bit signal 148i rate. The weight retriever and distributor circuit 128 retrieves from memory 136 (portrayed with reference to FIG. 1) the weight determining signal data and downloads that data into a weight buffer circuit 156. The weight buffer circuit 156 provides any required temporary storage of the downloaded memory data to assure that each multi-bit vector for a switched random weight bit signal 148i bit is delivered on time to each weight generator 112i. The buffer circuit 156 reconciles the data demand of the weight generators 112i with the data volume and format supplied by the memory 136. For instance, a first range of bits can be downloaded from the memory 136 to the buffering circuit 156 at a first set of times while the data field that constitutes the weight buffering signal 124i is of a different size as the first range of bits and downloaded to the weight generator at a different set of times corresponding to the generation of the bits of the weight bit signal 148, and thus is synchronized with the weight generator 112i circuit providing the corresponding test data bit to the test data bit stream 148. The design of the weight buffer circuit 156, the memory 136, and the Weight Retriever and Distributor (WRD) Control circuit 164 are interrelated as will be understood by those skilled in the art. In the preferred embodiment, the Weight Retriever and Distributor circuit 128 provides the timing signal to the remaining portion of the data download circuit 168 and the weight generator circuit 112 to provide synchronized control signals between the weight buffer circuit 156, the memory mapping unit 132, and the weight generator circuit 112i. In another embodiment, the data download circuit 168 reads an already existing clock such as the weight generator circuit 112i clock to control the interface of the remainder of the data downloading circuit 168 and the weight generator circuit 112i.

The preferred embodiment of the present invention includes a memory unit 136 that is an on-die memory, preferably a memory that is already a part of the integrated circuit under-test exclusive of a built-in self-test function, and preferably a cache memory of the integrated circuit. In another embodiment, the memory 136 will be an on-die dedicated built in self-test memory, and in another embodiment the memory 136 will be an off-die unit.

The memory 136 in an embodiment stores each multi-bit vector necessary to determine a single bit of a weight bit signal 148i for each single bit needed for the given scan chain 104i, for each scan chain 104i, for each of at least one distinct set of weight determining signal inputs 124, each separate set comprising the data to determine a test data bit stream 148 for the scan chains 104 having a distinct probability of a high and a low value for each bit and referred to herein as a data set.

For instance, in an embodiment, the memory 136 stores a multiple set of distinct weight determining signal data fields wherein one set of weight determining signals is a collection of the weight determining signal data fields to determine a weighted scan input bit for each scan cell in the circuit under-test. If the circuit under-test contains "m" scan chains and each scan chain contains "p" scan cells (where there is no requirement that each scan chain contain the same number of cells), there are m*p distinct cells and a single set of weight determining signals may contain m*p weight determining vectors. The m*p weight determining vectors are retrieved from the memory 136 (and sequentially from the data download circuit 168) to generate a parallel pattern that is applied to the scan chains 104i. In application of the circuit of the present invention, this procedure is repeated many times, each time retrieving the same m*p weight determining signals to generate distinct parallel patterns having possibly different bit values but the same probabilities. Each separate set of weight determining signals generates random bit signals 148 having distinct probabilities.

The stored multi-bit vectors provide a deterministic weighting to combinational circuit elements of the circuit under-test based on the desired weighting of the input signal after an analysis of the circuit under-test. Although the preferred embodiment requires a large amount of data to drive each of the switches 152 for a given circuit under-test, a typical VLSI circuit under-test memory capacity has a storage capacity that accommodates very large test data.

The memory mapping circuit 132 provides conventional memory control to the memory 136 for performing a read and a write from and to the memory 136. In conventional DRAM devices, the memory mapping circuit is often termed a memory controller, and in conventional cache devices, the memory mapping circuit is often termed a bus interface unit or a memory interface unit. Under the control of the Weight Retriever and distributor Controller circuit 164, the memory mapping unit circuit downloads weight data from the memory 136 to the weight buffer 156, from addresses provided by the Weight Retriever and Distributor controller circuit 164.

The Weight Retriever and Distributor controller circuit 164 provides a control signal to the Memory Mapping Unit and the address of stored data fields in the Memory 136 for a download of the data fields to the weight buffer 156 via the Cache Address buffer 160, in response to a retrieve weight command and weight set number from a circuit the inventors preferably term a Weighted Random Pattern Test Controller 140. Preferably the Weighted Random Pattern Test Controller 140 is an on-die circuit as well.

Figure 4:
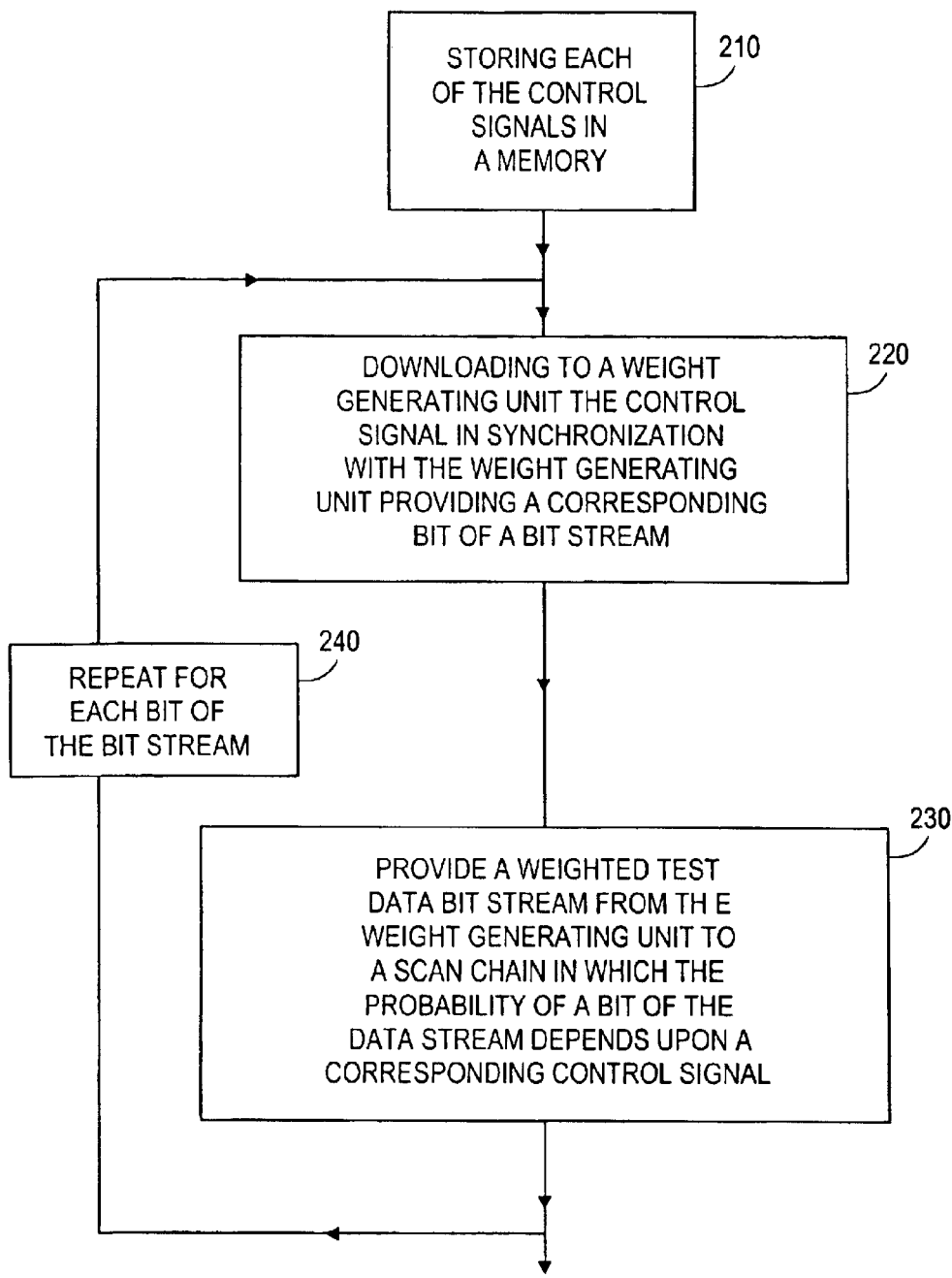
FIG. 4 portrays a flow chart of an embodiment of a method for providing a weighted test data bit stream to a scan chain for a single set of control signals according the present invention. The order of description should not be construed as to imply that these operations are necessarily order dependent.

Referring to FIG. 4, an embodiment of a method of generating a weighted random test bit signal (148i) for a data set includes in Block 210, a memory unit (136) storing a data set containing each of the control signals 124 for determining a weight of a bit of a bit stream (148i) to be input into a scan chain (104i) of an integrated circuit under-test. Each distinct set of control signals 124 has a corresponding distinct data set. In Block 220, a data field containing the control signal is downloaded from the memory to a weight generating unit (112i) in synchronization with the weight generating unit providing a corresponding bit of the bit stream. In an embodiment, the downloading includes reading a portion of the data set from the memory at a rate of a first number of bits at a first set of times, storing the read portion in a buffering circuit, and downloading from the buffering circuit a data field at a second set of times, the second set of times being in synchronization with the data bit stream rate such that the weight of a bit of the bit stream depends upon the corresponding data field. The details of this process have already been taught with reference to FIGS. 1-3. Preferably the memory is disposed on the integrated circuit and as well as already existing on the integrated circuit apart from its use as a storage device for the data set, such as a unit of the integrated circuit.

In Block 230, the weight generating unit provides the weighted random test bit signal to the scan chain, the scan chain disposed on the integrated circuit die (102). The weight of a bit of the bit stream depends upon a corresponding data field that is part of the data set, and in which the data field was downloaded to the weight generating unit. The details of this process have already been taught with reference to FIGS. 1-3. It is worth noting now that in an embodiment, the weight generating unit includes a switch that has a plural number of differently weighed input bit streams and a control signal that consists of substantially the corresponding data field. It is also worth noting that in an embodiment, the weight generating unit is disposed on the integrated circuit die. In Block 240, Blocks 220 and 230 are repeated for a new bit of the bit stream with a particular control signal for that bit.

While certain exemplary embodiments have been described and shown in the accompanying drawings, it is to be understood that these embodiments are merely illustrative of and not restrictive of the broad invention. The present invention is not limited to the specific constructions and arrangements shown and described, and alternative embodiments will become apparent to those skilled in the art to which the present invention pertains without departing from the scope of the present invention. The scope of the present invention is defined by the appended claims rather than the foregoing description.

We claim:

1. An apparatus, comprising:
    a die having an integrated circuit, the integrated circuit having "m" scan chains, each scan chain to be scanned having "p" scan cells, the die having:
    a weighted random pattern generator on the die, the weighted random pattern generator having:
        a pseudo-random pattern generator to generate pseudo-random binary bits;
        a memory to store m*p multi-bit vectors, the vectors to determine weights to be applied to the pseudo-random binary bits;
        set of weighted pseudo-random bit generators corresponding to the set of scan chains;
        circuitry to retrieve the weights from memory and to distribute the weights to the set of weighted pseudo-random bit generators, the weighted pseudo-random bit generators to apply the weights to the pseudo-random binary bits to generate weighted pseudo-random bits; and
        a controller to control the retrieval and distribution of the weights.

2. The apparatus of claim 1, further comprising a circuitry to select a a vector to be retrieved.

3. The apparatus of claim 2, further comprising a circuitry to select a memory location for the vector to be retrieved.

* * * * *